United States Patent [19]

Tanabe

[11] Patent Number: 5,451,891
[45] Date of Patent: Sep. 19, 1995

[54] POTENTIAL DETECTING CIRCUIT
[75] Inventor: Akira Tanabe, Tokyo, Japan
[73] Assignee: NEC Corporation, Japan
[21] Appl. No.: 959,755
[22] Filed: Oct. 13, 1992
[30] Foreign Application Priority Data Oct. 25, 1991 [JP] Japan .................................. 3-279367

[51] Int. Cl.$^6$ ............................................... H03K 5/24
[52] U.S. Cl. .................................................. 327/89
[58] Field of Search ....................... 327/54, 56, 77, 78, 327/89

[56] References Cited
U.S. PATENT DOCUMENTS

| | | | |
|---|---|---|---|
| 4,780,625 | 10/1988 | Zobel ........................ | 327/54 |
| 4,961,007 | 10/1990 | Kumanoya et al. .......... | 327/77 |
| 5,057,704 | 10/1991 | Koyanagi et al. ........... | 327/78 |
| 5,191,235 | 3/1993 | Hara ........................ | 327/77 |

Primary Examiner—Willis R. Wolfe
Attorney, Agent, or Firm—Laff, Whitesel, Conte & Saret, Ltd.

[57] ABSTRACT

An object of the present invention is to enable detection of a precise substrate potential even when the substrate potential of the detecting circuit is at a lower level than the substrate to be measured, and to allow free setting of the stable detection level without being affected by fluctuation in the power supply potential. To that end, there are provided an operational amplifier for differential amplification when the ground potential and the positive power supply potential are supplied, a first resistor for transmitting the substrate potential to the first input terminal of the operational amplifier, a constant voltage circuit, and a reference voltage generating circuit for supplying a positive reference voltage to the second input terminal of the operational amplifier.

2 Claims, 6 Drawing Sheets

POTENTIAL DETECTING CIRCUIT

FIELD OF THE INVENTION

The present invention relates to a potential-detecting circuit and in particular, to a potential-detecting circuit for detecting the potential of a substrate used in a semiconductor integrated circuit.

BACKGROUND OF THE INVENTION

Conventionally, in a semiconductor integrated circuit such as a semiconductor memory or the like, a potential-detecting circuit for detecting whether the potential of the substrate is higher or lower than a predetermined level, as shown in FIG. 1 (a) and FIG. 1 (b), is formed such that one end of a plurality of diode devices, each connected in series (in FIG. 1(a), diodes D21 through D23, and in FIG. 1(b), transistors Tr 21 through Tr23 connected to diodes), is connected to the substrate, the potential of which is to be measured, and the other end of the series is connected to the power supply potential point (power potential Vcc) via resistor R21 while being entered to an inverter 4A.

In this potential-detecting circuit, the diode device operates as a constant voltage circuit, and the potential Va at the input terminal of the inverter 4A is changed by the same value as substrate voltage Vbb is changed so that this change is detected by inverter 4A to detect the change of the substrate potential Vbb. Incidentally, substrate potential Vbb is normally on a negative level.

In the foregoing conventional circuit, the diode devices working as the constant voltage circuit are connected between the input terminal of the inverter 4A and the substrate to be measured. Since the substrate potential is normally on a negative level, the potential of the electrode of these diode devices often becomes lower than the ground potential. Therefore, when this potential-detecting circuit is incorporated with an integrated circuit including the substrate to be measured and the substrate potential of the potential-detecting circuit is not set to a level below the potential level of the substrate to be measured, current can flow between these electrodes and the substrate, making detection of exact substrate potential impossible.

Further, since diode devices are used as the constant voltage circuit, it is impossible to precisely adjust the potential at both of its terminals. In consequence, the relationship between the substrate potential Vbb and the potential Va at the input terminal of the inverter 4A cannot be precisely adjusted, and this in turn makes it impossible to freely select the potential at which the inverter 4A inverts the output.

In addition, when the power potential Vcc is changed, since the threshold voltage of inverter 4A is changed, the fluctuation of the power potential Vcc also changes the detection level of the substrate potential Vbb at which the inverter 4A inverts the output, even though the potential Va at the input terminal of the inverter 4A does not actually change.

SUMMARY OF THE INVENTION

Accordingly, an object of the present invention is to provide a potential-detecting circuit which allows the substrate potential to be precisely detected while not being affected by fluctuation of the power potential, thereby allowing the detection level of the substrate potential to be freely set even when its own substrate potential is not set to a level below the substrate potential to be measured.

The potential-detecting circuit according to a first aspect of the invention comprises: an operational amplifier, which is a differential amplifier having a first and second input terminals for differential operation when the ground potential and a positive potential are supplied; a first resistor, one end of which is connected to the substrate the potential of which is to be measured; a constant voltage circuit, which is a means for generating a constant voltage whose low potential side is connected to the other end of the first resistor and whose high potential side is connected to the first input terminal of the operational amplifier; a reference voltage-generating circuit, which is a means for generating a reference voltage for supplying a positive reference voltage to the second input terminal of the operational amplifier; and a second resistor connected between the output terminal and the first input terminal of the operational amplifier.

The potential-detecting circuit according to a second aspect of the invention comprises: a comparator, which has first and second input terminals and functions when the ground potential and a positive power potential are supplied; a first resistor with one end connected to the substrate the potential of which is to be measured and the other end connected to the first input terminal of the comparator; a first constant current source, one end of which is connected to the other end of the first resistor and the other end of which is supplied by the positive power supply potential; and a reference voltage-generating circuit comprising a second resistor, one end of which is connected to the ground potential point and the other end of which is connected to the second input terminal of the comparator, and a second constant current source, one end of which is connected to the other end of the second resistor and the other end of which is supplied by the positive power supply potential for supplying the positive reference voltage to the second input terminal of the comparator.

The potential-detecting circuit according to a third aspect of the invention comprises: a first potential-detecting part, which is a means for detecting the potential for discriminating the level of the substrate potential with the first reference voltage as a reference; a second potential-detecting part, which is a means for detecting the potential for discriminating the level of the substrate voltage with the second reference voltage as a reference; and an output part for emitting the result determined by the first and second potential-detecting portions as a single result.

According to the potential-detecting circuit of the present invention, since the transistors and the diodes all operate at the positive potential, their own substrate potential can be set to the same level as the ground potential. In addition, by changing the value of the resistor of the reference voltage generating circuit, the substrate potential to be detected can be varied over a wide range. Further, due to the use of differential amplification, the potential to be detected will not affected by changes in the power supply potential.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENTS

Several embodiments of the present invention will next be described with reference to the accompanying drawings.

Figure 2:
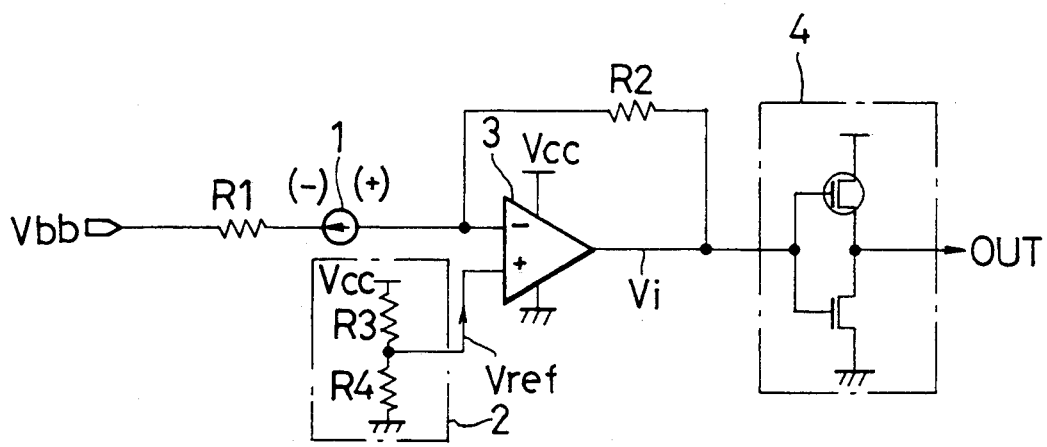
FIG. 2 is a circuit diagram illustrating a first embodiment of the present invention.

FIG. 2 is a circuit diagram illustrating a first embodiment of the present invention.

This embodiment comprises an operational amplifier 3 having first and second input terminals for differential operation when the ground potential and positive power potential Vcc are supplied, resistor R1 with one end connected to the substrate (substrate potential Vbb) the potential of which is to be measured, a constant voltage circuit 1 with its low-potential side (−) connected to the other end of resistor R1 and its high-potential side (+) connected to the first input terminal (−) of the operational amplifier 3, a reference voltage-generating circuit 2 having resistors R3 and R4 connected in a series between the power supply potential Vcc and the ground potential point for supplying a positive reference voltage Vref to the second input terminal (+) of the operational amplifier 3, resistor R2 connected between the output terminal and the first input terminal (−) of the operational amplifier 3, and an inverter 4 for inverting and amplifying the output signal Vi of the operational amplifier 3.

According to this embodiment, since the reference voltage Vref is set to a positive potential, all of the circuit elements except resistor R1 directly connected to the substrate to be measured can be operated at a positive potential, and the substrate potential of this circuit itself can therefore be made equal to the ground potential. In other words, the substrate potential of this circuit need not to be set to a level below the voltage of the substrate to be measured.

Operation during fluctuation of the power potential Vcc will next be described. Here, the input signal (Vi) level at which the inverter 4 inverts the output is assumed to be Vcc/2.

Assuming that when $Vi = Vcc/2$, the substrate potential Vbb, that is, the threshold value associated with the substrate potential Vbb, is Vbbth, the voltage of constant voltage circuit 1 will be E and the value of each resistor will be represented by the same sign as the resistor itself, then, $$Vi = Vcc \times R4/(R3+R4) + R2[Vcc \times R4/(R3+R4) - Vbbth - E]/R = Vcc/2 \quad (1)$$

Thus, $$Vcc[R4(1+R2/R1)/(R3+R4) - \tfrac{1}{2}] = R2(Vbbth+E) \quad (2)$$

If the value of R1 through R4 and E is set in accordance with the relationship: $[R4/(R3+R4)] \times (R1+R2)/R1 = \tfrac{1}{2}$, $Vbbth = -E \ldots$ (3), the threshold value of the substrate potential Vbb will become constant even if the power supply potential Vcc should fluctuate.

Further, since reference voltage Vref can be freely set depending on resistors R3 and R4, it is also possible to freely set the threshold value of the substrate potential Vbb, that is, the level (hereinafter referred to as the detection level) at which the inverter 4 inverts the output.

Incidentally, since the input voltage (VI) of the inverter 4 equals $Vref + R2 \, (Vref - Vbb - E) \, R1$, and $Vref = Vcc \times R4/(R3+R4) \ldots$ (4), the potential change Vbb of the substrate is multiplied by R2/R1 to be entered to the inverter 4. As described above, by setting R2/R1 to a level greater than 1, the detection sensitivity of this circuit can be increased to a higher level than in conventional examples.

Figure 3:
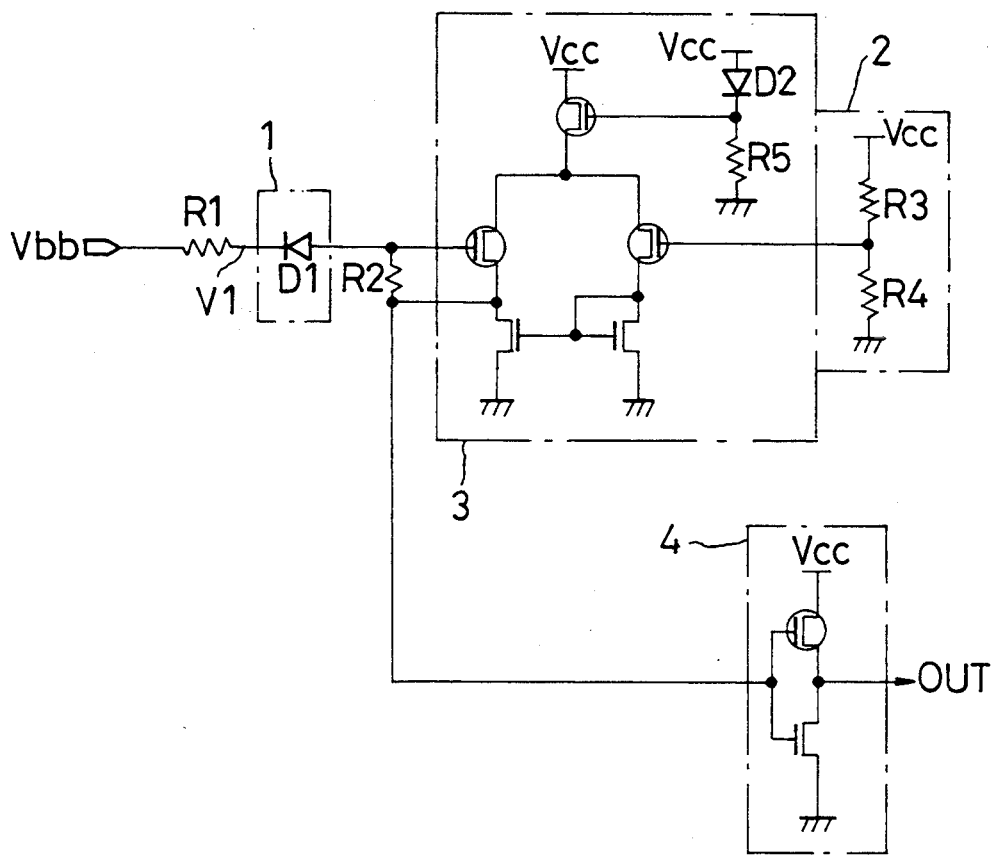
FIG. 3 is a circuit diagram on the circuit element level of a constant voltage circuit and an operational amplifier according to the embodiment of FIG. 2.

FIG. 3 is a circuit diagram in which the constant voltage circuit 1 of the embodiment of FIG. 2 is formed with diode D1 and operational amplifier 3 is shown on the transistor level as a current mirror type.

In this case, since the potential E at both ends of diode D1 cannot be significantly changed, if E cannot be made equal to −Vbb, the fluctuation of the power potential Vcc will cause the threshold value of the substrate potential Vbb to fluctuate. If R1 through R4 are set such that the threshold value is Vbb0 at a particular value Vcc0 of the power supply potential Vcc, the change of this threshold value will accord with the following relationship according to formula (2).

$$Vcc0 \times R1[R4 \times (1+R2/R1)/(R3+R4) - \tfrac{1}{2}] = Vbb0 + E \quad (5)$$

When the threshold value Vbbth of the substrate potential Vbb is evaluated by using this relationship, $Vbbth = Vcc0 \times R1[R4 \times (1+R2/R1)/(R3+R4) - \tfrac{1}{2}] - E = (Vbb0+E) \times Vcc/Vcc0 - E \ldots$ (6)

Thus, $dVbbth/dVcc = (Vbb0+E)/Vcc0 \ldots$ (7) By making E as close to −Vbb0 as possible, the change in the threshold value of the substrate potential Vbb caused by the power supply potential Vcc can be made small. In the conventional example shown in FIG. 1, since Va changes by the same amount as that of substrate potential Vbb, $Vbbth = Vcc/2 - E \ldots$ (8)

Therefore, $dVbbth/dVcc = \tfrac{1}{2} \ldots$ (9)

Figure 1A:
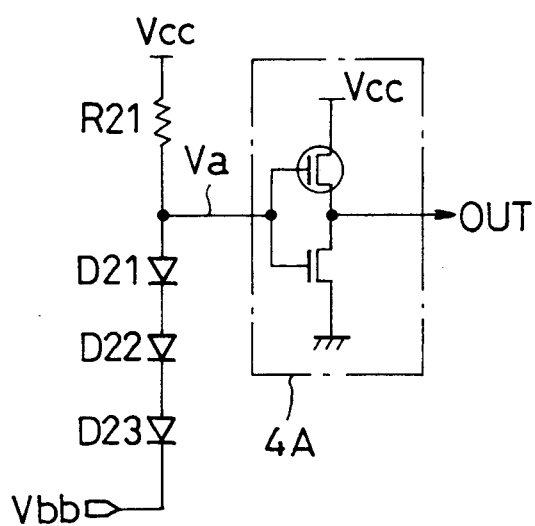
FIGS. 1(a) and 1(b) are circuit diagrams illustrating a first and second embodiment of a conventional potential-detecting circuit.
Figure 1B:
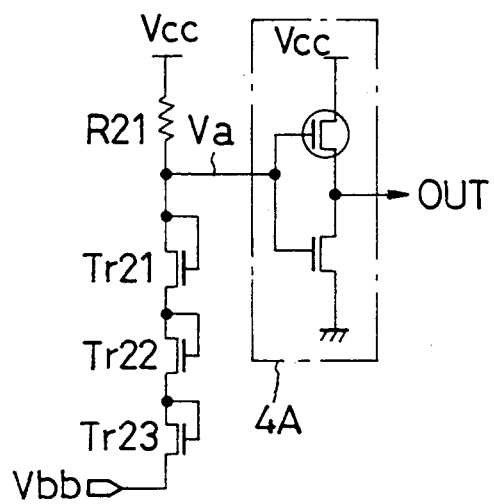

Therefore, if R1 through R4 are set so that $(Vbb0+E)/Vcc < \tfrac{1}{2} \ldots$ (10), fluctuation in the threshold value of the substrate potential Vbb can be made smaller than in the conventional example of FIG. 1.

Further, if the potential at both ends of diode D1 is made smaller than the reference voltage Vref, since the potential V1 at the cathode side of diode D1 is always positive, the substrate potential of this potential-detecting circuit itself can be made equal to the ground potential.

Figure 4:
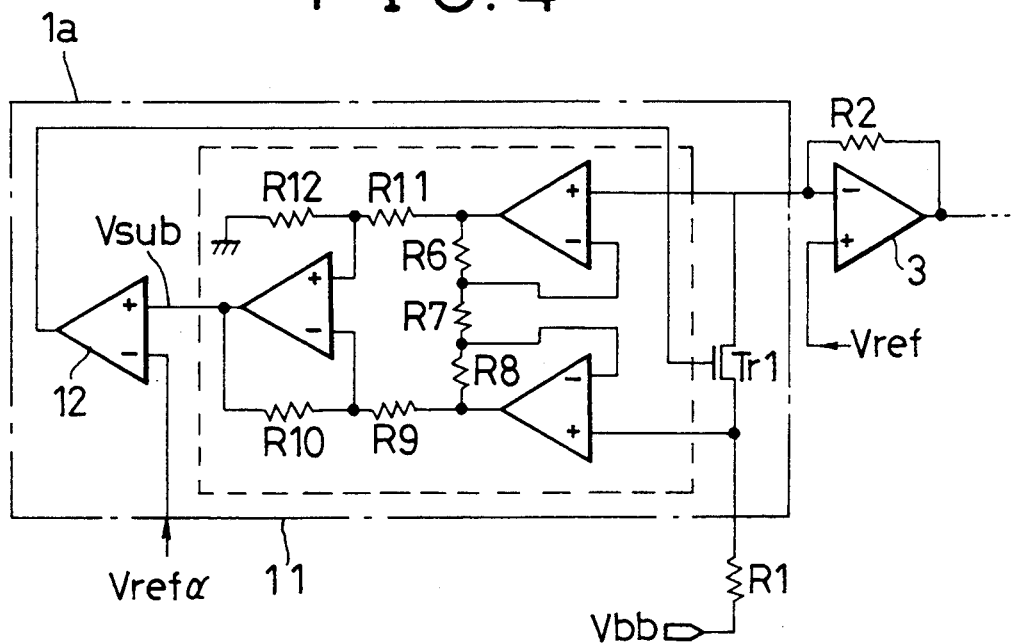
FIG. 4 is a circuit diagram illustrating another embodiment of the constant voltage circuit according to the embodiment of FIG. 2.

FIG. 4 is a constant voltage circuit of the embodiment of FIG. 2 comprising a subtracting circuit 11, transistor Tr1, and a comparator 12. If the potentials at both ends of transistor Tr1 of FIG. 4 are assumed to be Vd and Vs respectively, and R9=R11 and R10=R12, the output Vsub of the subtracting circuit 11 will be as follows:

$$Vsub = (R6 + R7 + R8) \times R9 \, (Vd - Vs)/(R7 \times R10) \quad (11)$$

Upon reaching the potential difference at which this and the reference voltage Vrefα of the comparator 12 are equal, (Vd−Vs) will become constant. Therefore, if Vsub = −Vbbth (R6+R7+R8)×R9/(R7×R10) . . . (12), it is possible to cancel fluctuation in the power supply potential Vcc.

Figure 5:
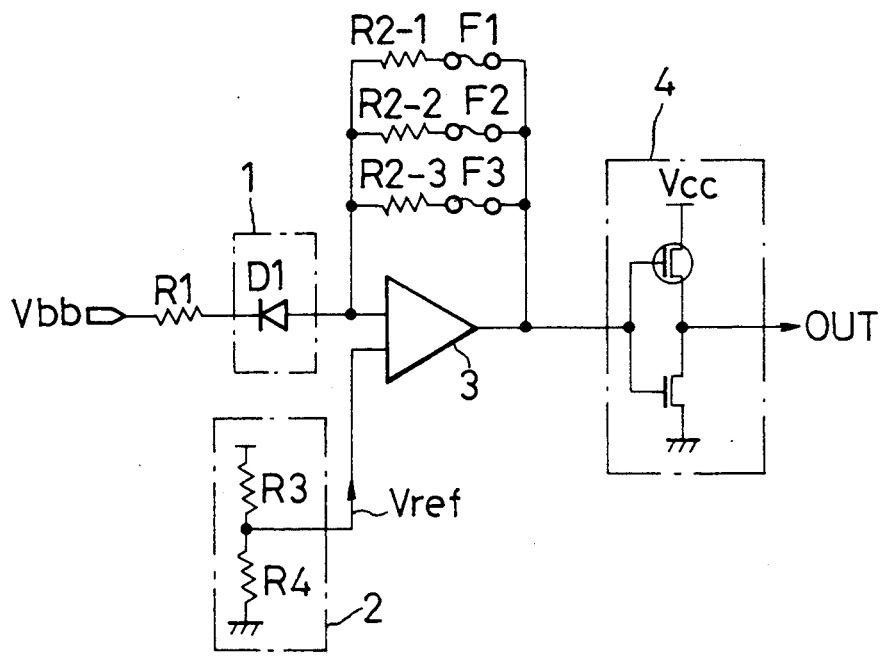
FIG. 5 is a circuit diagram illustrating another example of a feedback resistor according to the embodiment of FIG. 2.

FIG. 5 is resistor R2 in the embodiment of FIG. 2 that comprises a plurality of resistors R2-1 through R2-3, each of which are connected in parallel, and fuses F1 through F3 connected in series. By cutting off fuses F1 through F3, the value of the resistor for feedback can be changed. With this arrangement, even after the element is formed, the resistor value for feedback can be changed, and the threshold value of the substrate potential Vbb can be changed.

Figure 6:
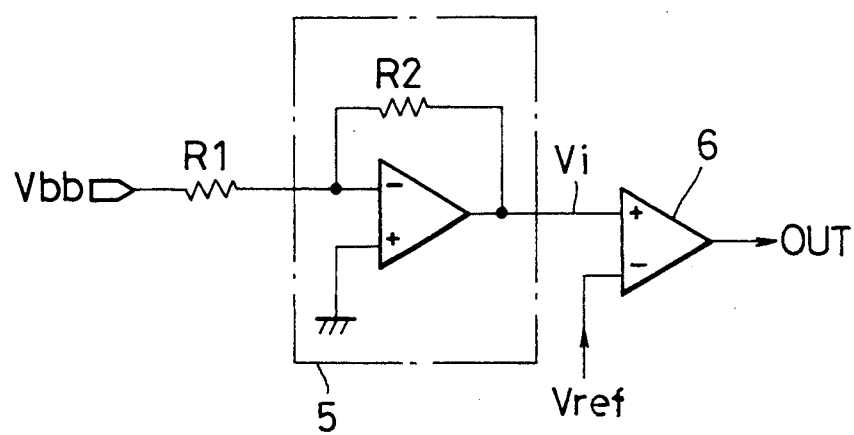
FIG. 6 is a circuit diagram illustrating a second embodiment of the present invention.

FIG. 6 is a circuit diagram illustrating a second embodiment of the present invention.

In this embodiment, the constant voltage circuit is formed with an inverting amplifier 5 and the operational amplifier is formed with a comparator 6. In this case, voltage E of the constant voltage circuit is "0," and the positive input terminal (+) of the inverting amplifier 5 is maintained at the ground potential or at a constant voltage.

With this arrangement, since comparison of the input potential Vi with the reference voltage Vref by the comparator 6 results in constant input potential Vi even with fluctuation in the power potential Vcc, the threshold value of the substrate potential Vbb will be constant (−Vref×R1/R2) regardless of the power supply potential Vcc.

Figure 7:
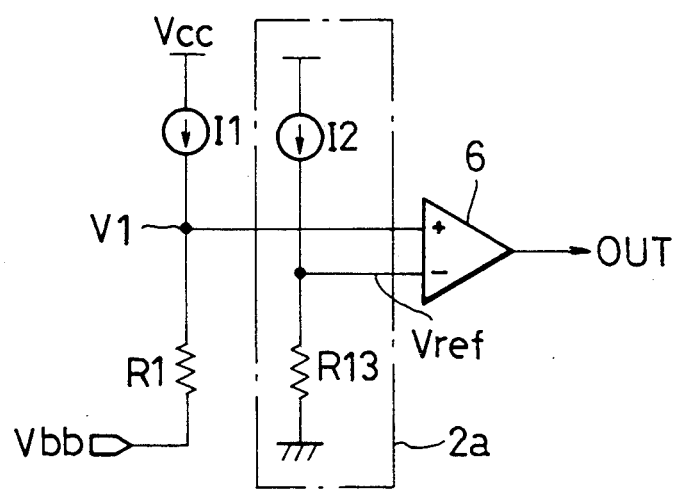
FIG. 7 is a circuit diagram illustrating a third embodiment of the present invention.

FIG. 7 is a circuit diagram illustrating a third embodiment of the present invention.

This embodiment comprises a comparator 6 having first and second input terminals which functions when the ground potential and the positive power potential Vcc are supplied, a first resistor R1 with one end connected to the substrate to be measured (substrate potential Vbb) and the other end connected to the first input terminal (+) of the comparator 6, a first constant current source 11 with one end connected to the other end of the first resistor R1 and the other end supplied by positive power supply potential Vcc, and a reference voltage-generating circuit 2a comprising a second resistor R13 with one end connected to the ground potential point and the other end connected to the second input terminal (−) of the comparator 6, and a second current source I2 with one end connected to the other end of the second resistor R13 and the other end supplied by positive power supply potential Vcc for supplying the positive reference voltage Vref to the second input terminal (−) of the comparator 6.

The current flowing through the constant current sources I1, I2 is always constant. Assuming that these currents are each I1 and I2, an evaluation of the potential V1 and reference voltage Vref at the first input terminal of comparator 6 gives $$V1 = R1 \times I1 + Vbb, \text{ and } Vref = R2 \times I2 \quad (13)$$

As a result, the threshold value of the reference potential Vbb will be (R2×I2−R1×I1). In view of the fact that this formula does not contain the term Vcc, it can be seen that the threshold value of the substrate potential Vbb will be constant regardless of the power supply potential Vcc.

Figure 8:
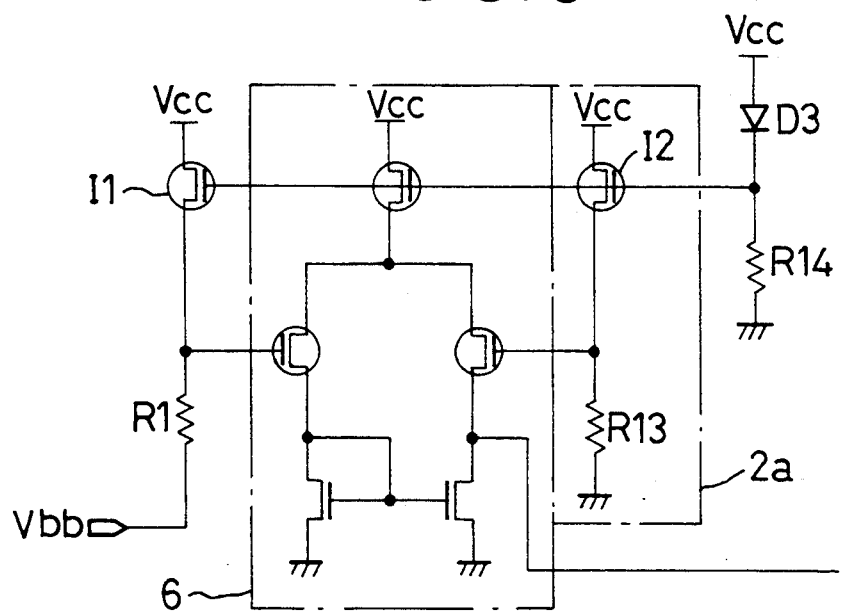
FIG. 8 is a circuit diagram illustrating a specific embodiment of a constant current source and a comparator according to the embodiment of FIG. 7.

FIG. 8 is a circuit diagram illustrating the constant current sources I1 and I2 and the comparator 6 illustrated in FIG. 7 on the circuit element level and showing the transistors, diodes, and the like.

Constant current sources I1, I2 are realized by saturating a MOS transistor for operation. Also in this embodiment, since the transistor and the diode are used at the positive potential as in the circuit of FIG. 3, the substrate potential of this circuit itself can be made equal to the ground potential.

Figure 9:
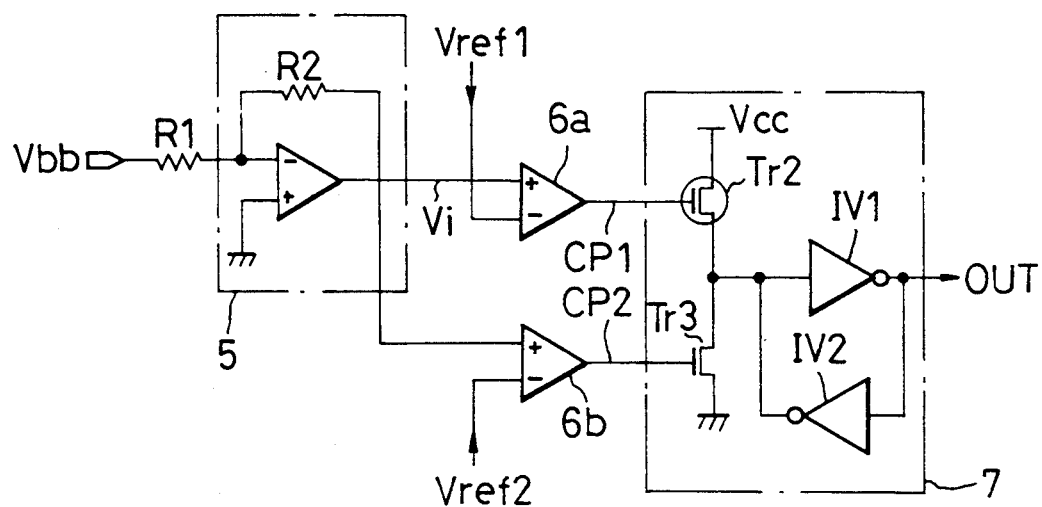
FIG. 9 is a circuit diagram illustrating a fourth embodiment of the present invention.

FIG. 9 is a circuit diagram illustrating a fourth embodiment of the present invention. This embodiment comprises a comparator 6a as a first potential-detecting part for discriminating the level of the substrate potential Vbb with the first reference voltage Vref1 as a reference, a comparator 6b as a second potential-detecting part for discriminating the level of the substrate potential Vbb with a second reference voltage Vref2 as a reference, and an output circuit 7 for emitting the result output by the first and second potential-detecting portions as a single result.

Figure 10:
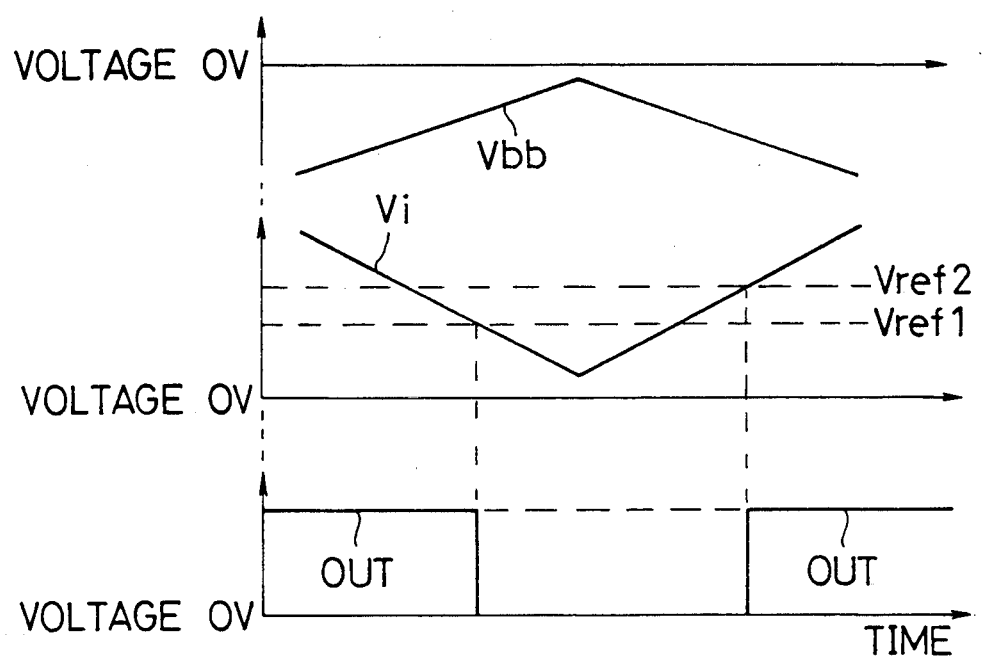
FIG. 10 is an operating waveform view of each signal for explaining the operation of the embodiment of FIG. 9.

FIG. 10 is a view of the operation waveform of this embodiment in which Vref1<Vref2. Since Vbb=−Vi×R1/R2, the operation of this embodiment is described based on the potential of Vi. The polarity of Vbb is the opposite to that of Vi.

First, if Vi>Vref2, since CP1 and CP2 are both at a high level, the output signal OUT will also be at a high level.

Since CP1 is at a high level, if the potential of Vi is lowered and Vref1<Vi<Vref2, CP2 will be switched to a low level and transistors Tr2 and Tr3 will both be cut off, and the level of the output signal OUT will not be changed.

If Vi is further lowered and Vi<Vref1, CP1 and CP2 will both be switched to a low level and, at last, the output signal OUT will be switched to a low level.

If Vi is elevated, Vi will be greater Vref2 and, at last, the output signal OUT will be switched to a high level.

As described above, by providing a hysteresis characteristic to the output signal OUT, the output signal OUT will not be changed and its operation will be stabilized even if it fluctuates within a narrow range around the threshold value of the substrate potential Vbb.

Incidentally, the circuit of FIG. 7 may be replaced by resistors R1, comparator 6a, and comparator 6b.

According to the present invention, since the substrate potential to be measured is transmitted to the first input terminal of the operational amplifier via the first resistor and the constant current circuit, the positive reference voltage is entered to the second input terminal of the operational amplifier and the ground potential and the positive power supply potential are supplied to the operational amplifier for differential amplification, resistors other than the first resistor connected to the substrate to be directly measured will operate at a positive potential, and the substrate potential itself can be made equal to the ground potential, making possible a precise measurement of the substrate voltage even if it is not set to a level below the potential of the substrate to be measured, and, since the substrate voltage and the positive voltage can be compared by the operational amplifier, a stable detection level can be freely set over a wide range without being affected by fluctuation in the power supply potential.

Although variations of the embodiment described above are possible, the scope of the present invention is defined in the appended claims.

What is claimed is:

1. A potential-detecting circuit comprising a differential amplifier means having first and second input terminals for enabling a differential operation and a third terminal for giving an output of the differential result, a first resistor having one end connected to a substrate to be measured, a constant voltage generating means having a low potential side connected to a second end of said first resistor and having a high potential side connected to said first input terminal of the differential amplifier means, a reference voltage generating means for supplying a positive reference voltage to said second input terminal of the differential amplifier means, and a second resistor connected between said third output terminal and said first input terminal of the differential amplifier means.

2. A potential-detecting circuit comprising first reference voltage generating means for supplying a reference voltage, second reference voltage generating means for supplying a positive reference voltage which is lower than said first reference voltage, a first potential-detecting means for discriminating the potential of a substrate to be measured with respect to said first reference voltage, a second potential-detecting means for discriminating said potential of said substrate with respect to said second reference voltage, and an output means for emitting the result of said first potential-detecting means when said potential of said substrate becomes higher than said first reference voltage and emitting the result of said second potential-detecting means when said potential of said substrate becomes lower than said second reference voltage.

* * * * *